United States Patent [19]
Yu

[11] Patent Number: 6,159,799
[45] Date of Patent: Dec. 12, 2000

[54] METHOD OF MANUFACTURING SEMICONDUCTOR DEVICE COMPRISING HIGH VOLTAGE REGIONS AND FLOATING GATES

[75] Inventor: Jae Min Yu, Chungcheongbuk-do, Rep. of Korea

[73] Assignee: Hyundai Electronics Industries Co., Ltd., Kyoungki-Do, Rep. of Korea

[21] Appl. No.: 09/383,409

[22] Filed: Aug. 26, 1999

[30] Foreign Application Priority Data

Dec. 1, 1998 [KR] Rep. of Korea ........................ 98-52266

[51] Int. Cl.[7] .................................................. H01L 21/336
[52] U.S. Cl. ........................... 438/257; 438/211; 438/258; 438/264
[58] Field of Search .................................... 257/500, 501, 257/316, 315; 438/257, 258, 263, 264, 211, 414, 201

[56] References Cited

U.S. PATENT DOCUMENTS

| | | | |
|---|---|---|---|
| 4,471,373 | 9/1984 | Shimizu et al. ........................ | 257/315 |
| 4,851,361 | 7/1989 | Schumann et al. ..................... | 438/201 |
| 5,057,448 | 10/1991 | Kuroda ................................... | 438/241 |
| 5,591,658 | 1/1997 | Cacharelis ............................... | 438/264 |
| 5,917,218 | 6/1999 | Choi et al. .............................. | 257/345 |

OTHER PUBLICATIONS

Seiichi Mori et al., High Speed Sub–halfmicron Flash Memory Technology with Simple Stacked Gate Structure Cell, 1994 Symposium on VLSI Technology Digest of Technical Papers, pp. 53–54.

*Primary Examiner*—Olik Chaudhuri
*Assistant Examiner*—Hoai Pham
*Attorney, Agent, or Firm*—Morgan, Lewis & Bockius LLP

[57] ABSTRACT

A method of manufacturing a semiconductor device includes the steps of preparing a substrate having a high-voltage applied region, a peripheral region, a cell region with at least first and second portions, the high-voltage applied region having a well formed therein; simultaneously forming a plurality of spaced floating gates on the first and second portions of the cell region and a plurality of spaced first gates on the high-voltage applied region; implanting first impurity ions in the high-voltage applied region of the substrate using the first gates as a mask to form a first impurity region, the floating gates masking the cell region from the first impurity ions; simultaneously forming control gates on the respective floating gates of the cell region and a plurality of spaced second gates on the peripheral region; selectively etching one of the control gates and one of the floating gates to form a plurality of gate patterns in the first portion of the cell region; and implanting second impurity ions in the substrate at sides of the gate patterns and at sides of the first gates to simultaneously form second impurity regions at sides of the gate patterns and twice implanted first impurity regions at sides of the first gates.

20 Claims, 9 Drawing Sheets

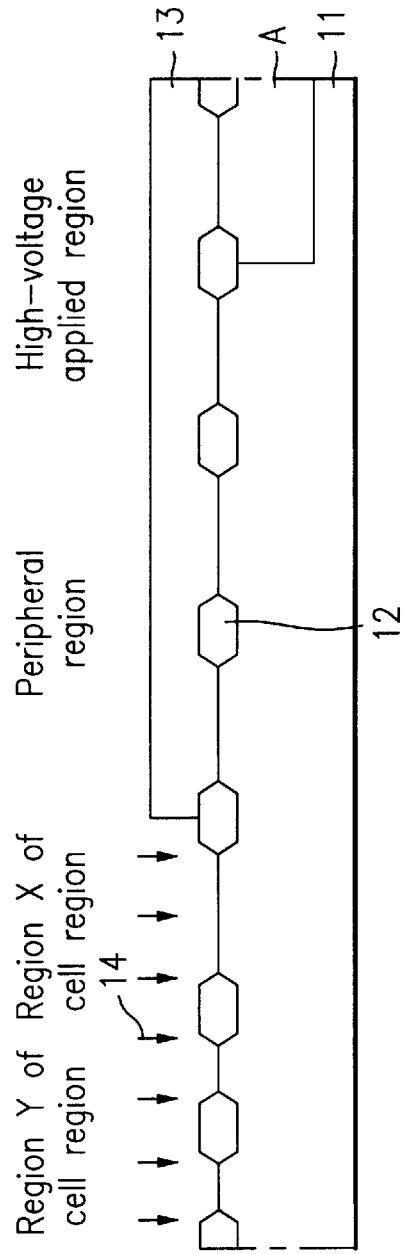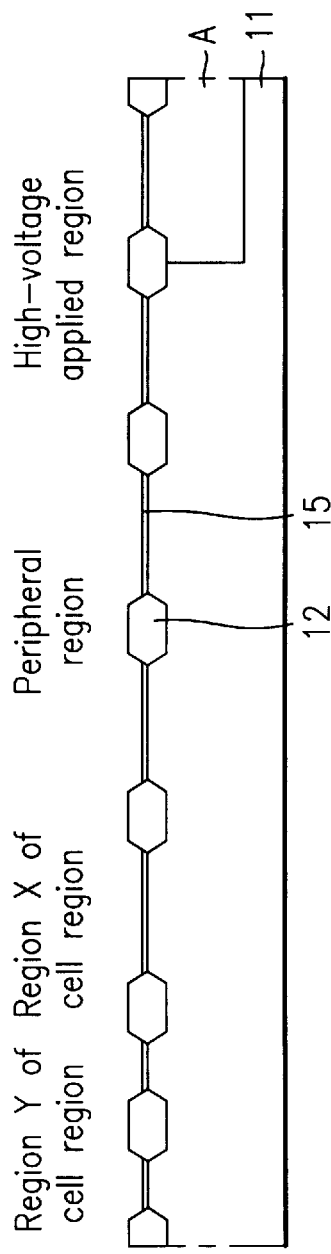

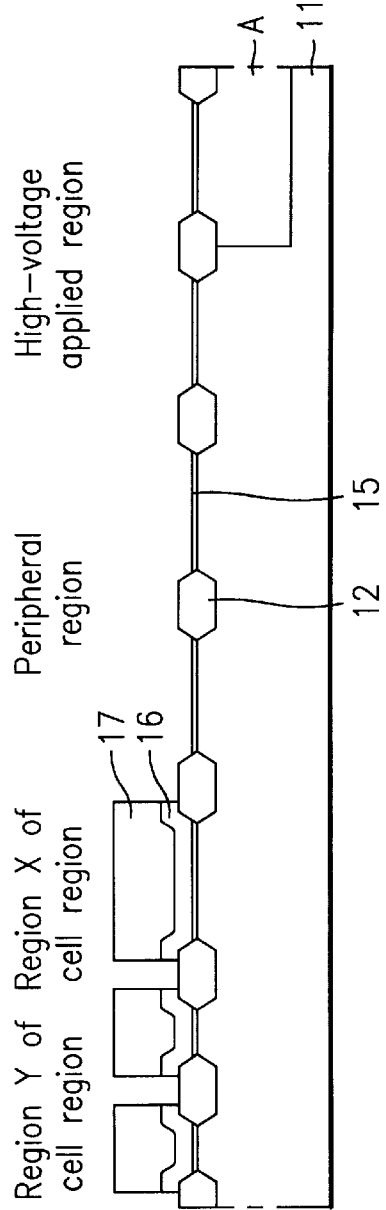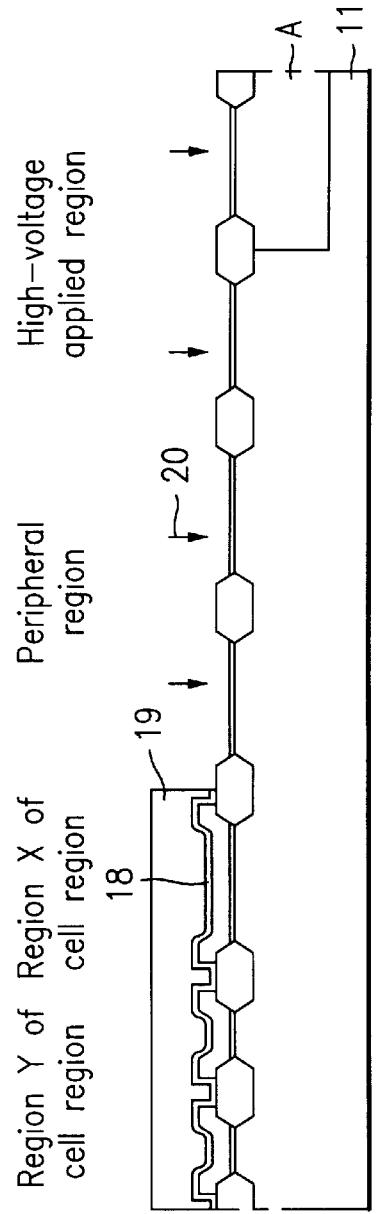

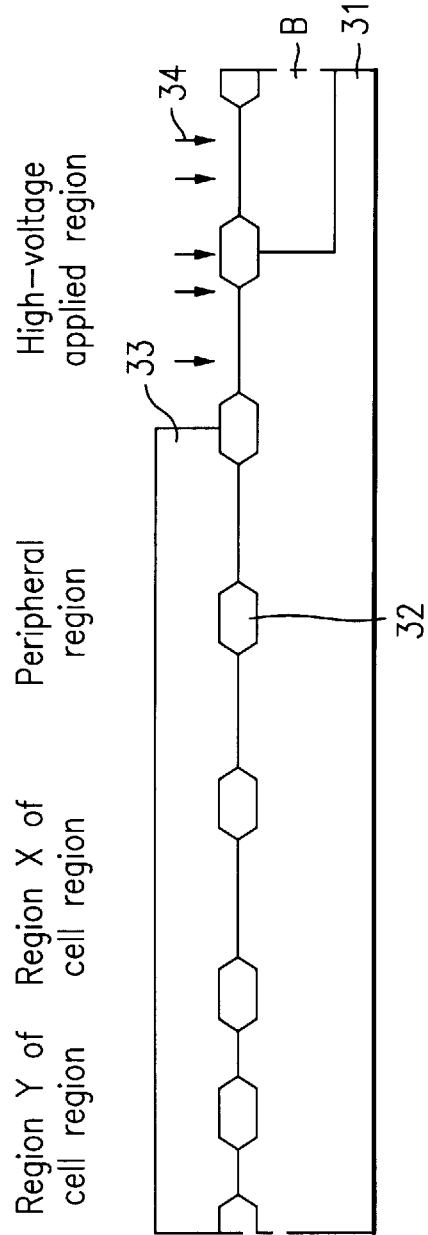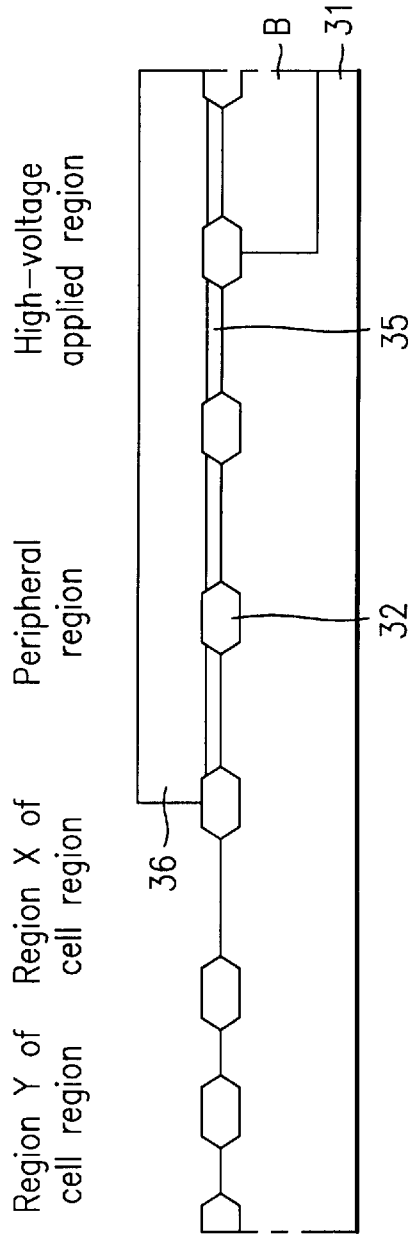

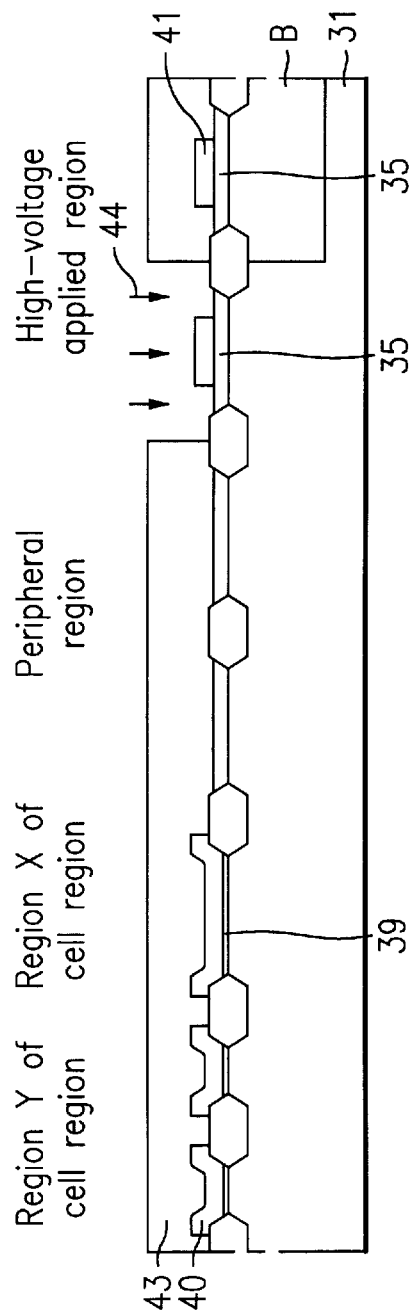
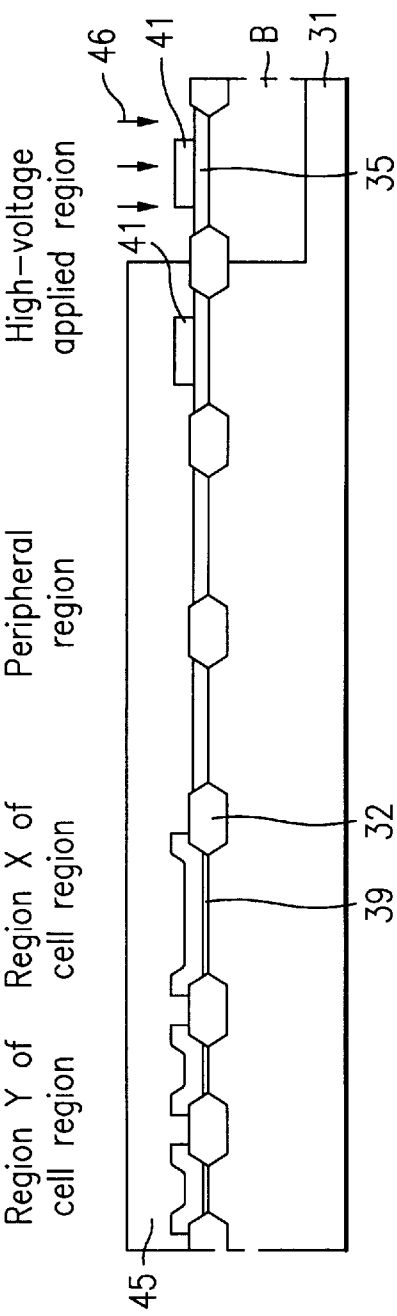

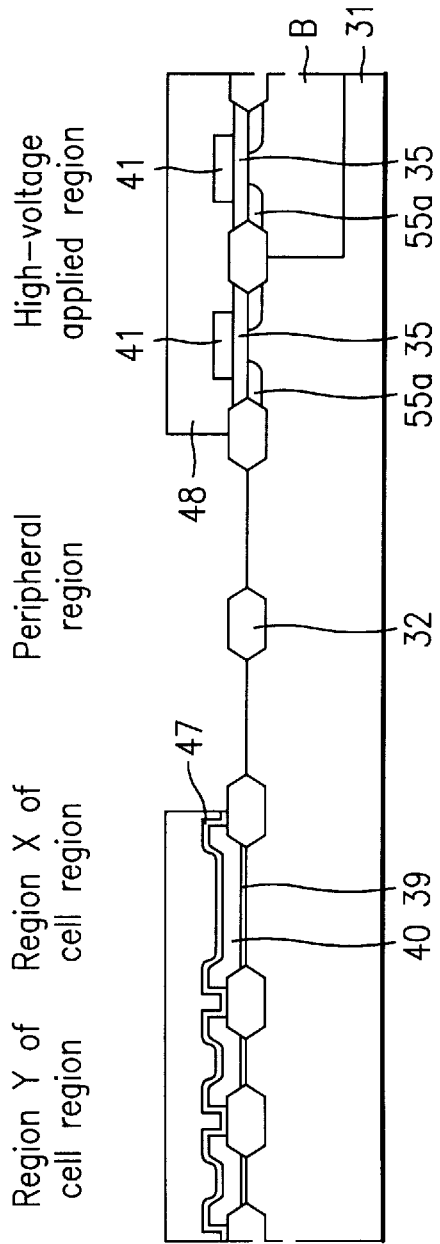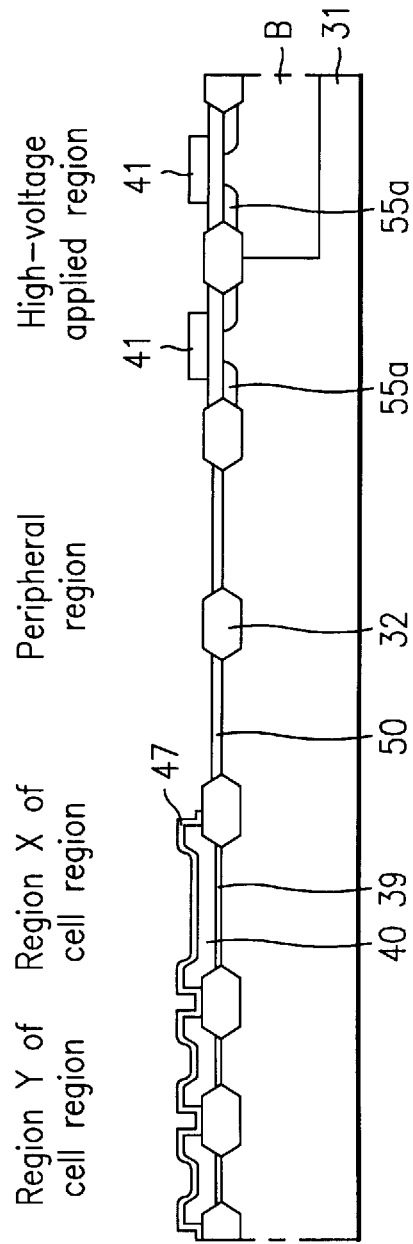

METHOD OF MANUFACTURING SEMICONDUCTOR DEVICE COMPRISING HIGH VOLTAGE REGIONS AND FLOATING GATES

This application claims the benefit of application Ser. No.: 52266/1998, filed in Korea on Dec. 1, 1998, which is hereby incorporated by reference.

BACKGROUND OF THE INVENTION

1. Field of the Invention

The present invention relates to a method of manufacturing a semiconductor device, and more particularly, to a method of manufacturing a semiconductor device to form transistors for a system on a chip.

2. Discussion of Related Art

Systems are commonly made on chips to obtain improved integration of semiconductor devices. In such systems formed on chips, different kinds of voltages are often required. For example, logic devices needing low voltages and other devices (such as erasable programmable read only memories (EPROMs) or electrically erasable programmable read only memories (EEPROMs)) needing high voltages are formed on the same chip. That is, the logic devices are embedded, short-channel, and low-voltage devices whereas the high-voltage devices such as EPROMs or EEPROMs employ high voltages of about 10V.

FIGS. 1A to 1G depict a method of manufacturing a conventional semiconductor device.

As shown in FIG. 1A, a region Y of a cell region, a region X of the cell region, a peripheral region, a high-voltage applied region, and a separation region are defined on a p-type semiconductor substrate 11. The cell region and the high-voltage applied region correspond to high-voltage devices, and the peripheral region corresponds to a logic device An n-well A is formed in a portion of substrate 11 where a p-channel metal oxide semiconductor (PMOS) device will be formed, and an oxidation process is carried out on a separation region of substrate 11 to form a plurality of field oxide films 12. A first photoresist film 13 is then applied over all the substrate 11. The first photoresist film 13 is selectively exposed to light, developed and removed from the portion corresponding to the cell region. Ions 14, for controlling a first threshold voltage $V_{th}$, are implanted to the cell region of substrate 11 using the selectively etched photoresist film 13 as a mask.

As shown in FIG. 1B, the remainder of the first photoresist film 13 is removed, and a tunneling oxide film 15 is formed to a thickness of 100 Å on substrate 11 by a thermal oxidation process performed on the surface of substrate 11. As shown in FIG. 1C, a first polycrystalline silicon film 16 and a second photoresist film 17 are formed on the surface, and the second photoresist film 17 is selectively etched by photolithography to remain on a portion of the cell region where floating gates will be formed. Then, the first polycrystalline silicon film 16 is selectively etched by photolithography using the selectively etched second photoresist film 17 as a mask. Thus, a plurality of floating gates 16 are formed on tunneling oxide film 15 of the cell region.

As shown in FIG. 1D, the remainder of the second photoresist film 17 is removed. Next, an oxide/nitride/oxide (ONO) film 18 and a third photoresist film 19 are formed on floating gates 16. The third photoresist film 19 is selectively etched by photolithography to remain on the cell region only, and the ONO film 18 is selectively etched by photolithography using third photoresist film 19 as a mask. Then, ions to control a second threshold voltage are implanted into the peripheral region and the high-voltage applied region of semiconductor substrate 11

As shown in FIG. 1E, the tunneling oxide film 15 is selectively etched through photolithography using the third photoresist film 19 as a mask, and the third photoresist film 19 is then removed. A first gate oxide film 21 is formed to a thickness of 200 Å or less in the peripheral region and the high-voltage applied region by thermal oxidation of the surface of substrate 11.

Next, a fourth photoresist film is applied over all the surface. The fourth photoresist film is selectively etched from the peripheral region only, and the first gate oxide film 21 is selectively etched using the selectively etched fourth photoresist film as a mask. The fourth photoresist film is then removed. A second gate oxide film 22 is formed to a thickness of 150 Å in the peripheral region using thermal oxidation.

As shown in FIG. 1F, a second polycrystalline silicon film and a fifth photoresist film 26 are formed over all the surface including second gate oxide film 22. Fifth photoresist film 26 is selectively etched to remain on a control gate of the cell region, gates of the peripheral region and gates of the high-voltage applied region. The second polycrystalline silicon is selectively etched by using the selectively etched fifth photoresist film 26 as a mask to form a control gate 23, a plurality of first gates 24, and a plurality of second gates 25 on each floating gate 16 of the cell region, second gate oxide film 22 of the peripheral region, and first gate oxide film 21 of the high-voltage applied region, respectively.

As shown in FIG. 1G, the remainder of the fifth photoresist film 26 is removed, and a sixth photoresist film is formed on the surface, including the plurality of second gates 25. The sixth photoresist film is selectively etched to remain on region Y of the cell region, the peripheral region, and the high-voltage applied region, and gate patterns of region X of the cell region only.

Control gate 23, ONO film 18, and floating gates 16 are selectively etched using the selectively-etched sixth photoresist film as a mask to form the gate patterns, and the remainder of the sixth photoresist film is removed. A seventh photoresist film is deposited over all the surface, and is then selectively etched to remain on n-well A only. N-type ions are implanted by using the selectively etched seventh photoresist film, field oxide films 12, control gate 23, and first and second gates 24 and 25 as a mask, and the seventh photoresist film is then removed.

An eighth photoresist film is deposited over all the surface, and the eighth photoresist film is selectively etched to be removed from the upper part of n-well A. P-type ions are implanted using the selectively etched eighth photoresist film as a mask, and the remainder of the eighth photoresist film is then removed. A drive-in diffusion is performed on the overall surface, and source/drain impurity regions 27 are formed within the portion of semiconductor substrate 11 at both sides of each floating gate 16 of region X of the cell region, the portion of substrate 11 at both sides of first and second gates 24 and 25, and n-well A between second gates 25.

The conventional method of manufacturing a semiconductor device has a number of problems.

For example, in the manufacturing method of a system on a chip as described, the high-voltage device and logic device have the same source/drain regions, and a short-channel device with a high impurity concentration cannot be made in the logic device thereby lowering the performance efficiency of the logic device.

Further, in the formation of a short-channel device in the logic device, a high junction breakdown voltage cannot be obtained in the high-voltage applied region of the high-voltage device due to the semiconductor substrate of high concentration and the shallow source/drain region. Thus, the performance efficiency of the high-voltage device is reduced.

Moreover, since the junction breakdown voltage of the logic device transistor in a device of 0.8 to 1.0 $\mu$m is more than 10V, the logic device and the high voltage device share the source/drain regions, and because the logic device transistor of 0.35 to 0.5 $\mu$m is less than 10V, the logic device and the high voltage device cannot share the source/drain regions.

SUMMARY OF THE INVENTION

Accordingly, the present invention is directed to a method of manufacturing a semiconductor device that substantially obviates one or more of the problems due to limitations and disadvantages of the related art.

An object of the present invention is to provide a method of manufacturing a semiconductor device by which a source/drain region of a logic device and a source/drain region of a high-voltage device's high-voltage applied region are formed individually in the formation of a system on a chip, thus enhancing the performance efficiency of a chip.

Additional features and advantages of the invention will be set forth in the description which follows, and in part will be apparent from the description, or may be learned by practice of the invention. The objectives and other advantages of the invention-will be realized and attained by the structure particularly pointed out in the written description and claims hereof as well as the appended drawings.

To achieve these and other advantages and in accordance with the purpose of the present invention, as embodied and broadly described, a method of manufacturing a semiconductor device comprises the steps of preparing a substrate having a high-voltage applied region, a peripheral region, a cell region with at least first and second portions, the high-voltage applied region having a well formed therein; simultaneously forming a plurality of spaced floating gates on the first and second portions of the cell region and a plurality of spaced first gates on the high-voltage applied region; implanting first impurity ions in the high-voltage applied region of the substrate using the first gates as a mask to form a first impurity region, the floating gates masking the cell region from the first impurity ions; simultaneously forming control gates on the respective floating gates of the cell region and a plurality of spaced second gates on the peripheral region; selectively etching one of the control gates and one of the floating gates to form a plurality of gate patterns in the first portion of the cell region; and implanting second impurity ions in the substrate at sides of the gate patterns and at sides of the first gates to simultaneously form second impurity regions at sides of the gate patterns and twice implanted first impurity regions at sides of the first gates.

In another aspect, a method of manufacturing a semiconductor device comprises the steps of preparing a substrate having a high-voltage applied region, a peripheral region, a cell region, the high-voltage applied region having an n-well formed therein; implanting ions in the substrate to define a first threshold voltage of the high-voltage applied region; forming a first gate insulating film on the surface of the substrate; implanting ions in the substrate to define a second threshold voltage of the cell region; etching the first gate insulating film from the cell region; performing a first cleaning of at least a surface of the cell region; forming a tunneling insulating film on the surface of the cell region of the substrate; simultaneously forming a plurality of spaced floating gates on the tunneling insulating film and a plurality of spaced first gates on the first gate insulating film of the high-voltage applied region; implanting n-type impurity ions in the high-voltage applied region on a side of the n-well and implanting p-type impurity ions in the n-well of the high-voltage applied region; forming an insulating layer on the floating gates a first diffused region of the n-type impurity ions implanted in the high-voltage applied region, and a second diffused region of the p-type impurity ions by a thermal treatment; implanting ions in the substrate to define a third threshold voltage of the peripheral region; etching the first gate insulating film of the peripheral region; performing a second cleaning of at least a surface of the peripheral region; forming a second gate insulating film on the peripheral region of the substrate; simultaneously forming control gates on the respective floating gates of the cell region and a plurality of spaced second gates on the second gate insulating film of the peripheral region; forming a plurality of spaced gate patterns on the tunneling insulating film by selectively etching one of the control gates, the corresponding one of the floating gates, and the first insulating film; and implanting second impurity ions in the substrate at sides of the gate patterns and at sides of the second gates to form third diffused regions at sides of the gate patterns and to simultaneously double diffuse the first and second diffused regions of the high-voltage applied region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 1A to 1G show the steps in a conventional manufacturing method of a semiconductor device; and FIGS. 2A to 2J show the steps in a manufacturing method of a semiconductor device in accordance with the present invention.

DETAILED DESCRIPTION OF PREFERRED EMBODIMENT

Figure 1E:
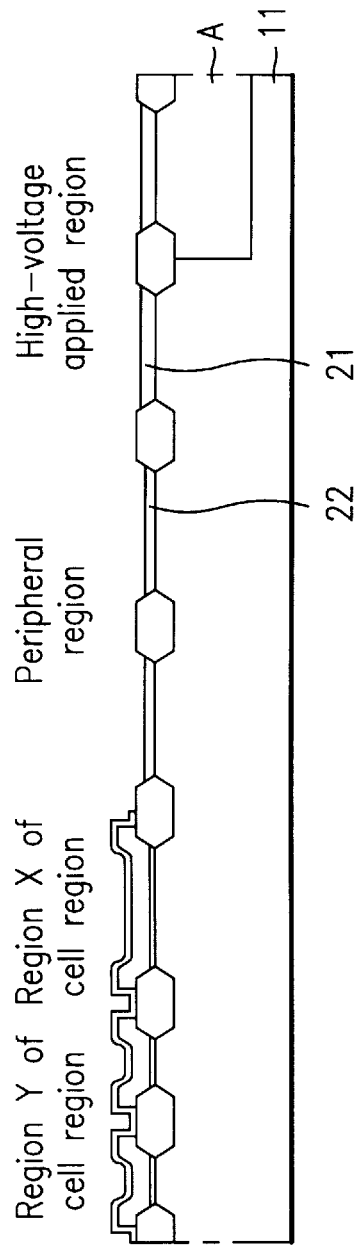
Figure 1F:
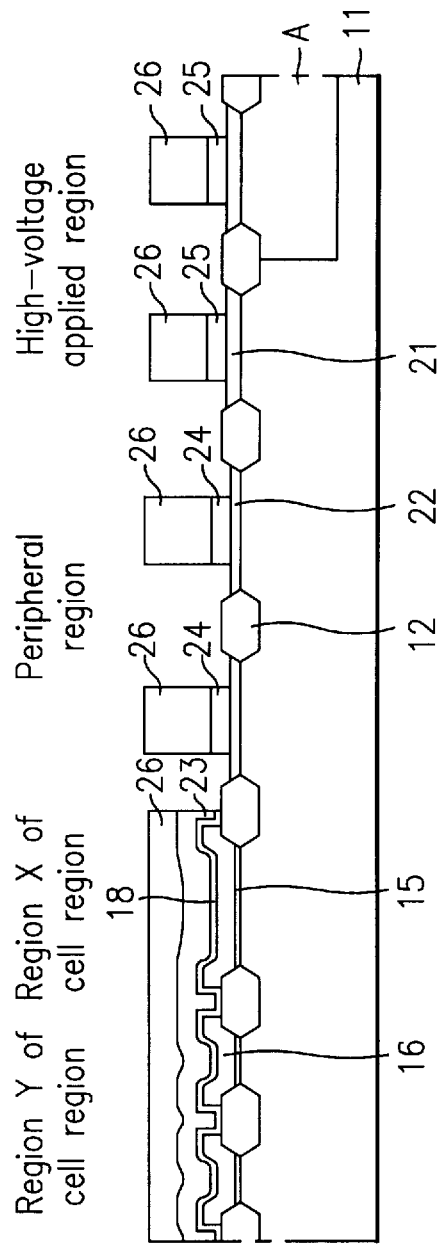
Figure 1G:
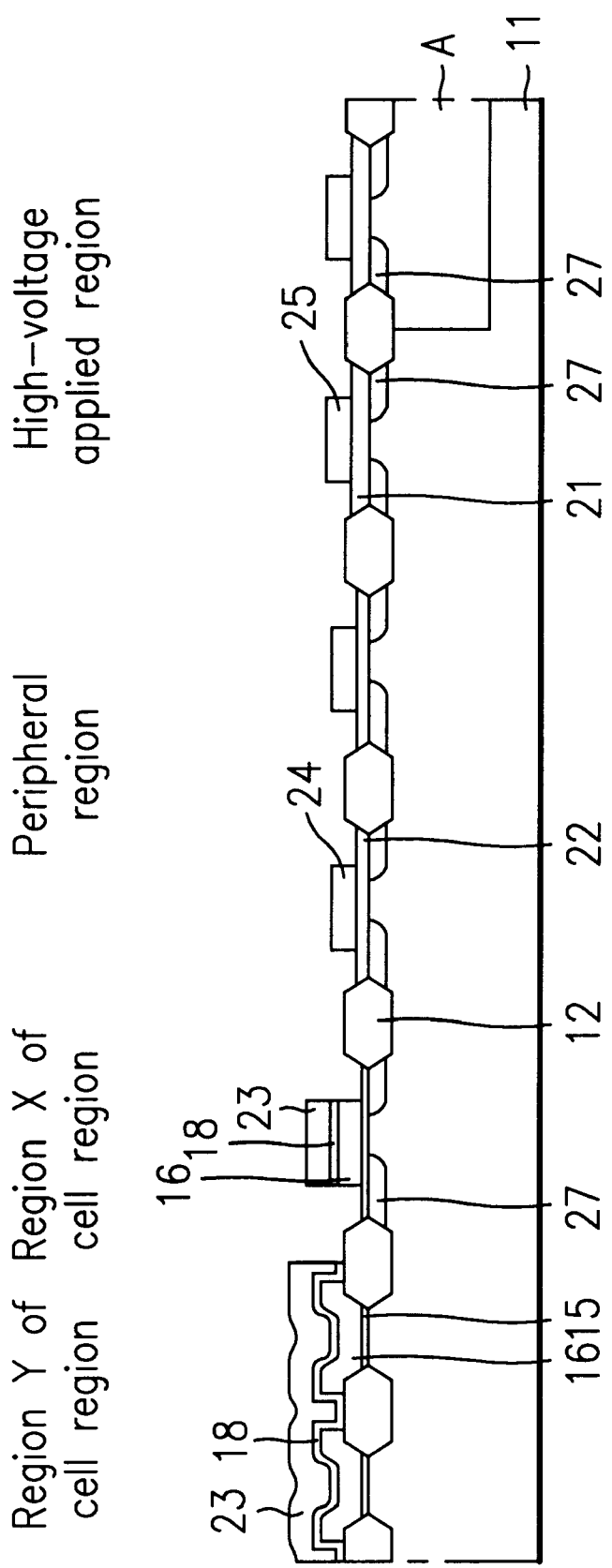

Reference will now be made in detail to the preferred embodiments of the present invention, examples of which are illustrated in the accompanying drawings.

FIGS. 2A to 2J illustrate a method of manufacturing a semiconductor device in accordance with the present invention.

According to the method of manufacturing a semiconductor device, as shown in FIG. 2A, regions Y and X of a cell region, a peripheral region, a high-voltage applied region, and a separation region are defined in a p-type semiconductor substrate 31. The cell region and the high-voltage applied region correspond to a high-voltage device while the peripheral region corresponds to a logic device. An n-well B is formed in a portion of the high-voltage applied region where a PMOS will be formed, and an oxidation process is carried out on substrate 31 of the separation region to form a plurality of field oxide films 32.

A first photoresist film 33 is deposited of the substrate 31 including field oxide films 32. The first photoresist film 33 is selectively exposed to light, developed, and removed from the high-voltage applied region only. Then, ions 34 for controlling a first threshold voltage are implanted in the high-voltage applied region of semiconductor substrate 31 using the selectively etched first photoresist film 33 as a mask. Here, ions for controlling a p-type threshold voltage are implanted in a portion of the high-voltage applied region where an N-type MOS will be formed, and ions for controlling an n-type threshold voltage are implanted in a portion of the high-voltage applied region where an N-type MOS will be formed.

As shown in FIG. 2B, the remainder of the first photoresist film 33 is removed, and a thermal oxidation is performed to form a first gate oxide film 35 to a thickness of 200 Å or less on substrate 31. A second photoresist film 36 is deposited on the resulting surface including first gate oxide film 35 and then selectively etched by photolithography from the cell region. Ions for controlling a second threshold voltage are implanted in the cell region using second photoresist film 36 as a mask, and first gate oxide film 35 is selectively etched. When first gate oxide film 35 is selectively etched, hafnium (Hf) is preferably used.

Figure 2C:
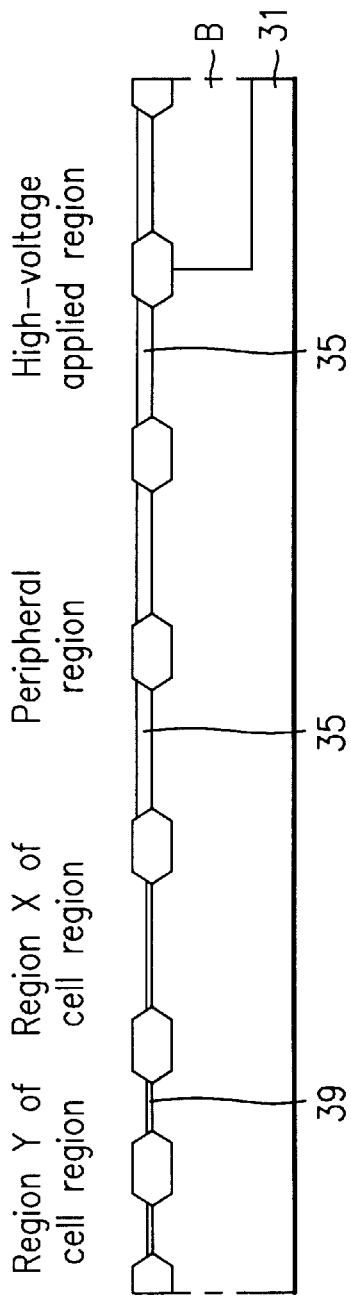

As shown in FIG. 2C, the remainder of the second photoresist film 36 is removed, and a standard cleaning (SC) process is performed. The overall surface is cleaned again with a solution of water and Hf (1:99). At that time, the first gate oxide film 35 is slightly etched. Thermal oxidation is performed on the resulting surface to form a tunneling oxide film 39 with a thickness of 100 Å or less on substrate 31. An oxide film is formed on first gate oxide film 35 to restore the thickness reduced during the cleaning processes.

Figure 2D:
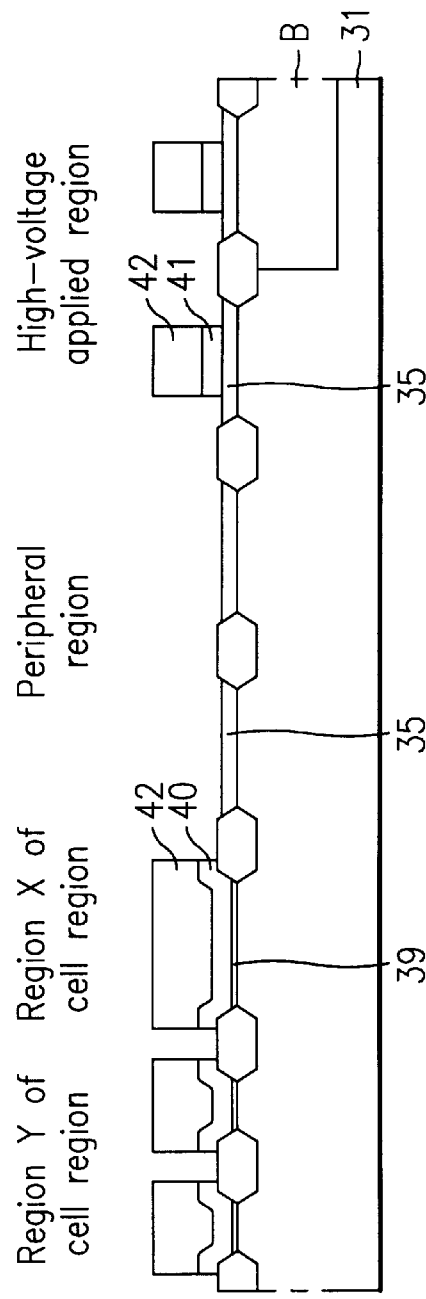

As shown in FIG. 2D, a first polycrystalline silicon film and a third photoresist film 42 are formed on the resulting surface, and third photoresist film 42 is selectively etched to remain on a portion of the cell region where floating gates are formed and a portion of the high-voltage applied region where first gates will be formed. The first polycrystalline silicon film is selectively etched using third photoresist film 42 as a mask. Thus, a plurality of floating gates 40 are formed on the cell region's tunneling oxide film 39, and first gates 41 are formed on the high-voltage applied region's first gate oxide film 35.

As shown in FIG. 2E, the remainder of the third photoresist film 42 is then removed, and fourth photoresist film 43 is formed on the resulting surface. Fourth photoresist film 43 is selectively etched from the portion of the high-voltage applied region where the NMOS is to be formed. Then, n-type impurity ions 44 are implanted thereto using fourth photoresist film 43 as a mask.

As shown in FIG. 2F, the remainder of fourth photoresist film 43 is removed, and a fifth photoresist film 45 is deposited all over the surface. Fifth photoresist film 45 is selectively etched from the portion of the high-voltage applied region where the PMOS is to be formed, and p-type impurity ions 46 are implanted using fifth photoresist film 45 as a mask.

As shown in FIG. 2G, the remainder of fifth photoresist film 45 is removed, and an ONO film 47 and a sixth photoresist film are formed. Here, n-type impurity ions 44 and p-type impurity ions 46, implanted in the high-voltage applied region by the thermal oxidation process used when forming ONO film 47, are first drive-in diffused to form first source/drain regions 55a. Then, the sixth photoresist film is selectively etched to remain in the cell region. The ONO film 47 is selectively etched using the selectively-etched sixth photoresist film as a mask. After that, the remainder of the sixth photoresist film is removed. Next, a seventh photoresist film 48 is deposited over the resulting surface including ONO film 47 and selectively etched to be removed from the peripheral region. Ions for controlling a third threshold voltage are implanted in the peripheral region using the seventh photoresist film 48 as a mask. First gate oxide film 35 is selectively etched using, for example, hafnium.

As shown in FIG. 2H, the remainder of the seventh photoresist film 48 is removed. The resulting surface is cleaned with the SC process and cleaned again with a solution of water and Hf (1:99). Here, first gate oxide film 35 will be slightly etched. The thermal oxidation process is performed on the surface to form a second gate oxide film 50 on substrate 31. An oxide film is formed on first gate oxide film 35 through thermal oxidation to the thickness prior to the cleaning process. The thickness of second gate oxide film 50 is determined according to the requirements of the device.

Figure 2I:
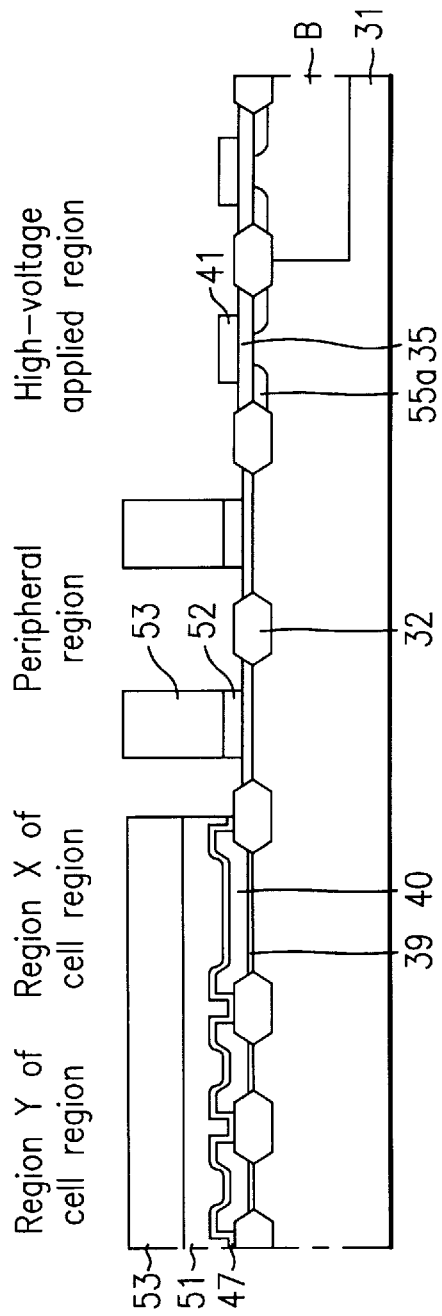

As shown in FIG. 2I, a second polycrystalline silicon film and an eighth photoresist film 53 are formed on the surface including second gate oxide film 50. The eighth photoresist film 53 is then selectively removed to remain on control gates of the cell region and a portion of the peripheral region where second gates will be formed. The second polycrystalline silicon film is selectively etched using the selectively-etched eighth photoresist film 53 as a mask. Thus, control gates 51 and second gates 52 are respectively formed on floating gates 40 and second gate oxide films 50 of the peripheral region.

Figure 2J:
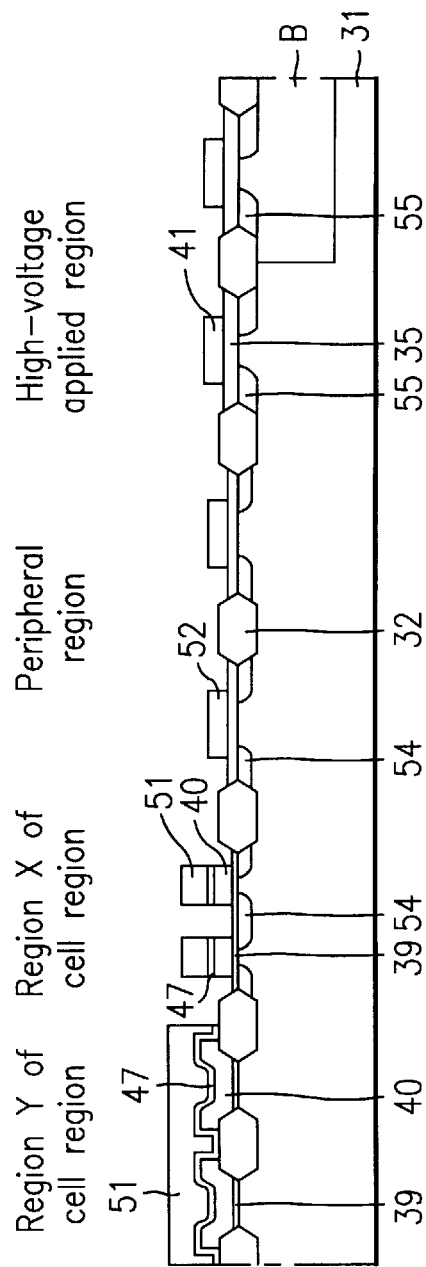

As shown in FIG. 2J, the remainder of the eighth photoresist film 53 is removed, and a ninth photoresist film is deposited on the surface including second gates 52. The ninth photoresist film is selectively etched to remain on the cell region Y, the peripheral region, the high-voltage applied region, and the gate pattern of cell region X. Using the selectively etched ninth photoresist film as a mask, control gates 51, ONO film 47, and floating gates 40 are selectively etched to form gate patterns. Then, the ninth photoresist film is removed.

A tenth photoresist film is deposited on the resulting surface including the gate patterns and selectively etched to remain on the high-voltage applied region only. Impurity ions are implanted using the tenth photoresist film, field oxide films 32, control gates 51, and first and second gates 41 and 52 as a mask. The tenth photoresist film is then removed. Thus, second source/drain regions 54 are formed by drive-in diffusion within a portion of semiconductor substrate 31 at both sides of each floating gate 40 of the cell region's region X, and within a portion of substrate 31 at both sides of second gate 52.

Each of n-type impurity ions 44 and p-type impurity ions 46 implanted in the high-voltage applied region by the thermal treatment used when forming second source/drain regions 54 is second drive-in diffused, thereby forming third source/drain regions 55 of a double diffused drain in a portion of substrate 31 at both sides of each first gate 41.

In the method of manufacturing a semiconductor device according to the present invention, the floating gates and the second gates are formed at the same time, and the logic device's source/drain regions and source/drain regions of the high-voltage device's high-voltage applied region are individually formed. Thus, a short-channel device is realized with a substrate of high concentration and shallow source/drain regions in the logic device, thereby enhancing the performance efficiency of the logic device. In addition, the source/drain regions of a double diffused drain are formed in the high-voltage device's high-voltage applied region, thereby obtaining a high junction breakdown voltage and improving the performance efficiency of a chip.

It will be apparent to those skilled in the art that various modifications and variations can be made in the method of manufacturing a semiconductor device of the present invention without departing from the spirit or scope of the invention. Thus, it is intended that the present invention cover the modifications and variations of this invention provided they come within the scope of the appended claims and their equivalents.

What is claimed is:

1. A method of manufacturing a semiconductor device, comprising the steps of:

preparing a substrate having a high-voltage applied region, a peripheral region, a cell region with at least first and second portions, the high-voltage applied region having a well formed therein;

simultaneously forming a plurality of spaced floating gates on the first and second portions of the cell region and a plurality of spaced first gates on the high-voltage applied region;

implanting first impurity ions in the high-voltage applied region of the substrate using the spaced first gates as a mask to form a first impurity region, the spaced floating gates masking the cell region from the first impurity ions;

simultaneously forming control gates each on respective ones of the spaced floating gates of the cell region and a plurality of spaced second gates on the peripheral region;

selectively etching one of the control gates and one of the spaced floating gates to form a plurality of gate patterns in the first portion of the cell region; and implanting second impurity ions in the substrate at sides of the gate patterns and at sides of the spaced first gates to simultaneously form second impurity regions at sides of the gate patterns and twice implanted first impurity regions at sides of the spaced first gates.

2. The method according to claim 1, further comprising the steps of:

implanting ions in the substrate to define a first threshold voltage of the high-voltage applied region;

implanting ions in the substrate to define a second threshold voltage of the cell region; and implanting ions in the substrate to define a third threshold voltage of the peripheral region.

3. The method according to claim 1, wherein the step of implanting the first impurity ions includes the step of performing a thermal treatment to diffuse the first impurity ions.

4. The method according to claim 1, wherein the step of implanting the second impurity ions includes the step of diffusing the second impurity ions by a thermal treatment.

5. The method according to claim 1, further comprising the steps of:

forming a first gate insulating film on the substrate at the high-voltage applied region;

forming a tunneling insulating film on the substrate at the cell region;

forming an insulating layer on the spaced floating gates of the spaced cell region; and forming a second gate insulating film on the peripheral region of the substrate;

wherein the floating gates are formed on top of the tunneling insulating film, the first gates are formed on top of the first gate insulating film, the control gates are formed on top of the insulating layer, and the second gates are formed on top of the second gate insulating film.

6. The method according to claim 5, wherein forming a first gate insulating film includes the step of forming the first gate insulating film on the substrate at the high-voltage applied region and the peripheral region, and wherein the step of forming the second gate insulating film includes the steps of etching the first gate insulating film of the peripheral region and forming a second gate insulating film on the peripheral region of the substrate.

7. The method according to claim 5, wherein the step of forming the first gate insulating film includes the steps of forming the first gate insulating film over the surface of the substrate, and etching the first gate insulating film from the cell region.

8. The method according to claim 7, wherein the first gate insulating film is etched using hafnium.

9. The method according to claim 5, wherein the step of forming the insulating layer includes the steps of performing a thermal treatment process to form an oxide and etching the oxide to remain on the cell region only.

10. The method according to claim 5, wherein the first gate insulating film is an oxide film formed to a thickness of 200 Å.

11. The method according to claim 5, wherein the tunneling insulating film is an oxide film formed to a thickness of 100 Å.

12. The method according to claim 5, wherein the insulating layer is an oxide/nitride/oxide film.

13. A method of manufacturing a semiconductor device comprising the steps of:

preparing a substrate having a high-voltage applied region, a peripheral region, a cell region, the high-voltage applied region having an n-well formed therein, implanting ions in the substrate to define a first threshold voltage of the high-voltage applied region;

forming a first gate insulating film on the surface of the substrate;

implanting ions in the substrate to define a second threshold voltage of the cell region;

etching the first gate insulating film from the cell region;

performing a first cleaning of at least a surface of the cell region;

forming a tunneling insulating film on the surface of the cell region of the substrate;

simultaneously forming a plurality of spaced floating gates on the tunneling insulating film and a plurality of spaced first gates on the first gate insulating film of the high-voltage applied region;

implanting n-type impurity ions in the high-voltage applied region on a side of the n-well and implanting p-type impurity ions in the n-well of the high-voltage applied region:

forming an insulating layer on the floating gates, a first diffused region of the n-type impurity ions implanted in the high-voltage applied region, and a second diffused region of the p-type impurity ions by a thermal treatment;

implanting ions in the substrate to define a third threshold voltage of the peripheral region;

etching the first gate insulating film of the peripheral region;

performing a second cleaning of at least a surface of the peripheral region;

forming a second gate insulating film on the peripheral region of the substrate;

simultaneously forming control gates on the respective floating gates of the cell region and a plurality of spaced second gates on the second gate insulating film of the peripheral region;

forming a plurality of spaced gate patterns on the tunneling insulating film by selectively etching one of the control gates, the corresponding one of the floating gates, and the first insulating film; and implanting second impurity ions in the substrate at sides of the gate patterns and at sides of the second gates to form third diffused regions at sides of the gate patterns and to simultaneously double diffuse the first and second diffused regions of the high-voltage applied region.

14. The method according to claim 13, wherein the first gate insulating film is an oxide film formed to a thickness of 200 Å.

15. The method according to claim 13, wherein the tunneling insulating film is an oxide film formed to a thickness of 100 Å.

16. The method according to claim 13, wherein the gate patterns are formed by selectively etching the control gates, the insulating layer, and the floating gates.

17. The method according to claim 13, wherein the first gate insulating film is etched by using hafnium.

18. The method according to claim 13, wherein the insulating layer is an oxide/nitride/oxide film.

19. The method according to claim 13, wherein in the first and second cleaning steps include a standard cleaning process followed by a cleaning with a solution of water and hafnium in the ratio of 1:99.

20. The method according to claim 13, wherein the step of forming the insulating layer on the floating gates includes the steps of forming the insulating layer on the surface including the floating gates while diffusing the implanted impurity ions of the first and second diffused regions by a thermal treatment, and selectively etching the insulating layer to remain on the floating gates.

* * * * *